United States Patent [19]

Luryi et al.

[11] Patent Number: 4,903,092
[45] Date of Patent: Feb. 20, 1990

[54] REAL SPACE ELECTRON TRANSFER DEVICE USING HOT ELECTRON INJECTION

[75] Inventors: Sergey Luryi, Millington; Alexander Kastalsky, North Plainfield, both of N.J.

[73] Assignee: American Telephone and Telegraph Company, AT&T Bell Laboratories, Murray Hill, N.J.

[21] Appl. No.: 339,892

[22] Filed: Apr. 17, 1989

Related U.S. Application Data

[63] Continuation of Ser. No. 894,396, Aug. 12, 1986, abandoned, which is a continuation of Ser. No. 532,604, Sep. 15, 1983, abandoned.

[51] Int. Cl.$^4$ ............................................. H21L 29/80
[52] U.S. Cl. ........................................ 357/22; 357/16; 357/41; 357/55
[58] Field of Search .................. 357/16, 22, 55, 41

[56] References Cited

U.S. PATENT DOCUMENTS

| | | | |
|---|---|---|---|
| 3,273,030 | 9/1966 | Balk et al. | 357/22 A |
| 3,678,302 | 7/1972 | Rasano et al. | 357/22 |
| 4,194,935 | 3/1980 | Dingle et al. | 357/22 |
| 4,257,055 | 3/1981 | Hess et al. | 357/16 |
| 4,353,081 | 10/1981 | Allyn et al. | 357/16 |
| 4,538,165 | 8/1985 | Chang et al. | 357/22 |
| 4,559,547 | 12/1985 | Shiraki et al. | 357/22 |
| 4,663,643 | 5/1987 | Mimura | 357/16 |

OTHER PUBLICATIONS

K. Hess, H. Morkoç, H. Shichijo and B. G. Streetman, "Negative Differential Resistance Through Real-Space Electron Transfer", Applied Physics Letters, vol. 35, No. 6, Sep. 15, 1979, pp. 469–471.

P. D. Coleman and J. Freeman, "Demonstation of a New Oscillator Based on Real-Space Transfer in Heterojunctions", Applied Physics Letters, vol. 40, No. 6, Mar. 15, 1982, pp. 493–495.

M. Keever, H. Shichijo, K. Hess, S. Banerjee, L. Witkowski, H. Morkoç and B. G. Streetman, "Measurements of Hot-Electron Conduction and Real-Space Transfer of $GaAs-Al_xGa_{1-x}As$ Heterojunction Layers", Applied Physics Letters, vol. 38, No. 1, Jan. 1, 1981, pp. 36–38.

M. Keever, K. Hess and M. Ludowise, "Fast Switching and Strorage in $GaAs-Al_xGa_{1-x}As$ Heterojunction Layers", IEEE Electron Device Letters, vol. EDL-3, No. 10, Oct. 1982, pp. 297–300.

Primary Examiner—Joseph E. Clawson, Jr.
Attorney, Agent, or Firm—Peter A. Businger

[57] ABSTRACT

Real space hot electron transfer devices using hot electron transfer between two conducting channels are described.

9 Claims, 2 Drawing Sheets

REAL SPACE ELECTRON TRANSFER DEVICE USING HOT ELECTRON INJECTION

This application is a continuation application Ser. No. 894,396, filed on Aug. 12, 1986 abandoned, which is a continuation of application Ser. No. 532,604 filed on Sept. 9, 1983 now abandoned.

TECHNICAL FIELD

This invention relates generally to semiconductor devices and particularly to that class of semiconductor device known as electron transfer devices and, more particularly, to such devices which transfer charge in real space between two conducting layers.

BACKGROUND OF THE INVENTION

There is a class of semiconductor devices the members of which are commonly termed transferred electron devices. Perhaps the first of such devices to be developed and understood is now commonly termed the Gunn diode. This device exhibits a negative differential resistance, i.e., the current decreases as the field increases, and is important in microwave applications and has been used as, for example, a local oscillator or power amplifier. This effect, i.e., negative differential resistance, arises in semiconductors which have a high mobility, low energy minimum and a low mobility, high energy minimum in the conduction band. The two minima are commonly referred to as the lower and upper valleys, respectively. As the electric field within the bulk semiconductor is increased, a point is reached at which some electrons are scattered from the high mobility, lower valley to the low mobility, upper valley and, as a result, the average carrier drift velocity is reduced as the electric field is increased after scattering to the upper valley commences. Hence, the current through the semiconductor decreases after this point because of the decrease in average carrier mobility even though the voltage or field is increased. The negative differential resistance leads to, for example, the generation of coherent microwave radiation at a frequency between 1 GHz and 100 GHz.

It will be readily appreciated by those skilled in the art that the term "transferred electron," as applied to devices such as the Gunn diode, refers to a transfer of electrons, not in real space, but in momentum space. The transferred electron effect results from bulk semiconductor properties.

More recently, real space transferred electron devices have been proposed. In these devices, the electrons are physically transferred from one portion of the device to another. In these devices, the transferred electron effect results from the device structure. For example, Hess et al proposed such a device in *Applied Physics Letters*, 35, pp. 469-471, Sept. 15, 1979. The structure described comprised, what is now termed by those skilled in the art, a modulation-doped structure. It comprised layers of highly doped AlGaAs which were sandwiched between layers of lightly doped or undoped GaAs. The carriers in the high bandgap AlGaAs layers reached their minimum energy level in the low bandgap GaAs layers which, because of the reduced impurity scattering, exhibit high mobility. Hess et al observed that when a high electric field was applied parallel to the interface, the ensemble of electrons in the GaAs layers was heated to relatively high temperatures. An ensemble of electrons is a group or collection of electrons. The carriers in the low mobility layers were not so heated since the velocity acquired by these carriers is proportional to the mobility which is low. Some of the resulting heated, i.e., nonthermal, carriers in the GaAs layers enter the AlGaAs layers by thermionic emission, and combine there with donor atoms. As a result, the current through the channel formed by the GaAs layers begins to decrease, and the structure exhibits negative differential resistance.

See also *Applied Physics Letters*, 38, pp. 36-38, Jan. 1, 1981, and *Applied Physics Letters*, 40, pp. 493-495, Mar. 15, 1982. The former paper reported current-voltage characteristics of GaAs/AlGaAs heterojunctions which the authors believed demonstrated real space electron transfer. The latter paper described a microwave oscillator. U.S. Pat. No. 4,257,055, issued on Mar. 17, 1981, described two- and three-terminal switches as well as a photodetector using the structure first described by Hess et al.

However, consideration of these devices leads one skilled in the art to realize that transferred carriers are trapped. Consequently, when the voltage is reduced, the current does not decrease as rapidly as would be desired because of the charge storage. As a result, the devices will be relatively slow.

Keever et al describe both switching and charge storage in *IEEE Electron Device Letters*, EDL-3, pp. 297-300, October 1982. The authors claimed that the carriers were transferred from a GaAs layer having a high electric field and hot electrons through an AlGaAs layer to a GaAs layer having a low electric field and cold electrons. The only effect that can be expected in this device is carrier storage in the "cold" GaAs layers which can lead to a negative differential resistance and memory effects. However, this device cannot be used for microwave generation or amplification since the return of electrons from the cold layers to the hot layers is slow. If the cold layer is electrically contacted, there will be no charge storage and no negative differential resistance. Storage effects on the scale of 1 minute observed by Keever et al are likely due to trapping in the AlGaAs layers, rather than storage in the cold layers since it appears difficult to effect electrical insulation of the side and main contacts of the depicted device.

SUMMARY OF THE INVENTION

We have found that a real space electron transfer device comprising first and second conducting channels, first and second electrical contacts to said first channel and a third electrical contact to said second channel, and a potential barrier between the first and second channels has useful properties. For example, it may be used in logic or amplifier applications, or it may be used as a microwave oscillator. Two of such devices connected in series permit fabrication of a bistable switch. Furthermore, the addition of a second gate to a second conducting channel results in an erasable memory device.

The device may be fabricated with Si, Ge, Group II-VI, and Group III-V compound semiconductors. The potential barrier may be a planar highly doped layer or it may be a potential barrier formed between two semiconductor layers, forming the two channels, by a semiconductor layer having a bandgap higher than the bandgaps of the conducting channels. In the latter case, the potential barrier is preferably graded with respect to its bandgap so that the electrons transferred from the first channel to the second cannot transfer in the reverse direction easily, i.e., the bandgap should decrease as the distance from the interface of the first channel and the high bandgap layer increases. In another embodiment, the second channel may be floating, i.e., it need not be electrically connected.

For reasons of clarity, the elements of the devices are not drawn to scale.

DETAILED DESCRIPTION

Figure 1:
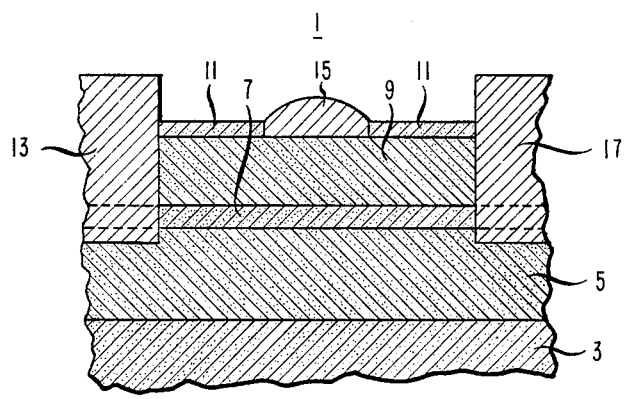
FIG. 1 is a sectional view of a device according to this invention.

One embodiment of a device according to our invention is depicted in sectional view in FIG. 1. The device, indicated generally as 1, comprises conducting substrate 3, first semiconductor layer 5, second semiconductor layer 7, third semiconductor layer 9, and semiconductor segments 11. The device further comprises contacts 13, 15, and 17 which form source, gate, and drain electrodes, respectively. Semiconductor layer 7 and substrate 3 form first and second conducting channels, respectively, and have first and second bandgaps, respectively. The first and second bandgaps may be equal or not. The source and drain electrodes may be referred to as first and second electrodes and the gate electrode as the third electrode. Layer 5 has a third bandgap which is greater than those of substrate 3 and layer 7 and thus forms a potential barrier between the two conducting channels. The potential barrier may be graded as discussed below. The carrier mobility in layer 7 is not critical. Layer 9 has a fourth bandgap which is greater than that of substrate 3 and layer 7. Substrate 3 may be electrically contacted by a fourth electrode.

In one embodiment, the device comprises a modulation doped heterostructure in which substrate 3 and layers 9 and 11 are doped while layers 5 and 7 are nominally undoped. On application of a source-drain voltage, the carriers reach their nonequilibrium state, characterized by an electron temperature, in layer 7, that is, the first channel, where, because of the reduced impurity scattering, they have high mobility.

In a further embodiment, the layers comprise Group II–VI and Group III–V compound semiconductors. In a still further embodiment, substrate 3 compries n-type GaAs, layer 5 comprises $Al_xGa_{1-x}As$ which is graded from $x \geq 0.3$ to $0.0 \leq x \leq 0.1$ so that the bandgap decreases as the distance from layer 7 increases, layer 7 comprises undoped GaAs, layer 9 comprises n-type AlGaAs, and segments 11 comprise n-type GaAs. Layer 5 is approximately 1500 Angstroms thick, layer 7 is approximately 200 Angstroms thick, and layer 9 is approximately 600 Angstroms thick.

The device may be grown by any conventional crystal growth technique such as molecular beam epitaxy. The metal contacts forming the source, gate, and drain electrodes are formed by conventional techniques that are well known to those in the art. The metal contacts for the source, gate and drain electrodes must not contact the second conducting channel.

Figure 2:
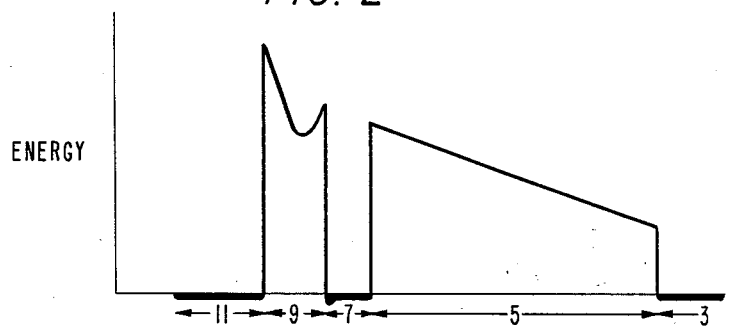
FIG. 2 plots the energy level vertically for the various regions of the device of FIG. 1.

The energy band diagram for the device of FIG. 1 is depicted in FIG. 2 with the bandgap in the various sections plotted vertically and the sections indicated horizontally by reference numerals identical to those used in FIG. 1. The regions where the electron gas is degenerate are indicated in black. Although section 5 is depicted as having a graded bandgap, with the bandgap decreasing with increasing distance from layer 7, other types of potential barriers between the two conducting channels may be used. For example, a planar doped triangular barrier may be used, or a blocking barrier analogous to a camel diode may be produced by ion implantation. A planar barrier is a term well known in the art and refers to a thin, highly doped layer.

The operation of the device will now be described for two conditions: first, when the substrate is biased positively with respect to the source and second, when the substrate is floating, i.e., either electrically unconnected or biased positively through a large resistance.

Carriers, for example, electrons within the high field region of the first channel, are heated by the source-to-drain electric field. They may be characterized by a temperature that can exceed the lattice temperature, that is, they may be termed "hot electrons." Depletion of carriers within the channel occurs because of the carriers that are emitted over the potential barrier and drift down the slope of the graded barrier with a saturated velocity. This represents a space charge limited current. As a result of carriers leaving the channel, there is a negative differential resistance in the drain circuit which may be used for, for example, microwave generation. The cut-off frequency of oscillation is determined by limiting times which correspond to the electron transit times on the graded barrier and in the high field portion of the channel. There is another limitation on frequency that arises from the finite time required for the hot electrons to come to equilibrium.

It should be noted that in an AlGaAs/GaAs heterostructure, the real space hot electron transfer is accompanied by a momentum space transfer of electrons which populates the higher energy and low mobility valleys. This effect may adversely affect device performance as it constitutes a limit on the efficiency of electron heating. However, the use of lattice matched heterostructures, such as InAlAs/InGaAs, in which the upper valleys are far removed in energy, permits the real space transfer to begin before population of the upper valley becomes appreciable.

Figure 3:
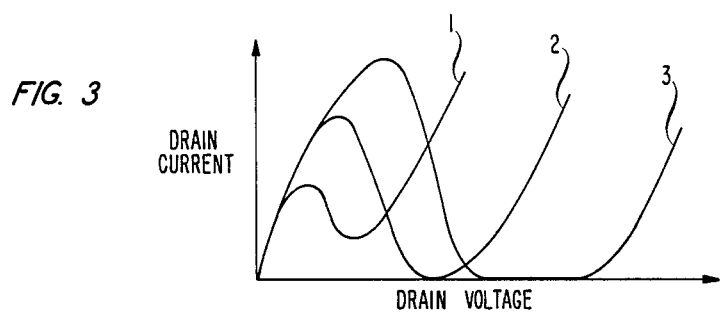
FIG. 3 plots the drain current vertically versus the drain voltage horizontally for various substrate voltages.

It will be appreciated by those skilled in the art that an increase in the electron temperature within the channel, caused by increasing the drain bias, causes enhanced injection into the substrate. After reaching the top of the potential barrier, the injected electrons drift downhill, i.e., toward the substrate, with a saturated velocity and thus constitute space charge dynamically stored in the barrier. This results in depletion of the channel and, consequently, a negative differential conductance in the source-to-drain circuit. FIG. 3 plots the drain current vertically versus the drain voltage horizontally for several substrate voltages. The curves, labeled as 1, 2, and 3, represent increasing substrate voltage, i.e., curve 2 represents a substrate voltage large than that of curve 1. It is apparent that the device exhibits a negative differential resistance. It is also apparent that the peak-to-valley ratio in current is quite large.

Figure 4:
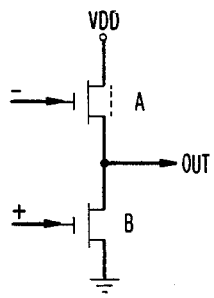
FIG. 4 illustrates an embodiment of a logic circuit using devices according to this invention.
Figure 5:
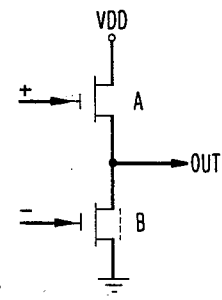
FIG. 5 illustrates another embodiment of logic circuits using devices according to this invention.

In addition to being used in microwave devices, the negative differential resistance may be exploited in logic devices. The operation of such a logic device will be better understood by reference to FIG. 4 and FIG. 5. Depicted in both figures are two devices, labeled A and B, according to our invention which are connected in series. When the total applied voltage exceeds twice the critical voltage which is required for the onset of negative differential resistance in a single device, an instability occurs. One device will be in a low field mode while the other will see practically the entire voltage. The device which contains a high field domain may be controlled by application of the gate voltage. The substrates in both devices are floating, i.e., unconnected or connected to positive terminals through resistances. When the gate of the lower device, i.e., B, is biased positively, then the high field domain is located in the top device, i.e., A, and vice versa. When the gate voltage is switched, the induced charge, which is shown by the dashed lines, moves within the substrate from one gate to the other. Once the high field domain is established by a gate voltage pulse, it remains in the same device indefinitely or until another pulse having opposite polarity is applied to the device.

In describing the above logic device, it has been assumed that the substrate is not electrically connected, that is, that the substrate is floating. The electron density in the high field channel region is now determined by the equilibrium condition between the hot electrons in the first channel and the cold electrons in the substrate, i.e., second channel. Channel depletion, because of hot electron emission over the potential barrier, results in an induced charge density on the conducting substrate adjacent the barrier. Consequently, the electric field resulting from the fixed positive charge, which is responsible for the creation of the interface channel, penetrates into the bulk and lowers the barrier for thermionic emission from the substrate into the channel. The hot electron charge density, $\sigma$, in the high field region of the channel is determined by the balance of fluxes over the barrier, and it can be shown that at high temperatures, $\sigma$ is proportional to $\exp(e\Psi/k\, T_e)$. $T_e$ represents the electron temperature, $\Psi$ represents the barrier height, and k is Boltzmann's constant. The gate voltage controls electron charge density in the field region through the saturation current, and the negative differential resistance effect is a strong function of the charge density. As the charge density becomes greater, depletion of the channel becomes less efficient. This results from the fact that the barrier height for thermionic emission of cold electrons from the substrate decreases linearly with the amount of charge transferred.

Figure 6:
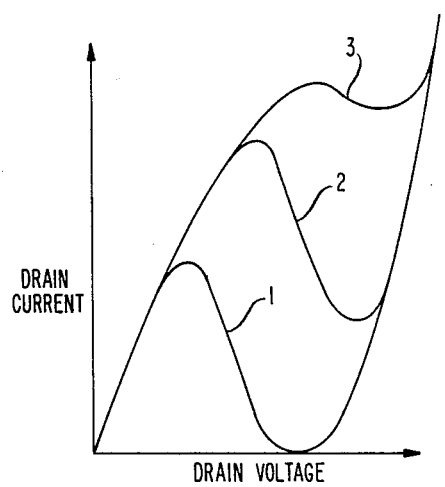
FIG. 6 plots the drain current vertically versus the drain voltage horizontally for various gate voltages.

FIG. 6 plots the drain current vertically versus the drain voltage horizontally for different gate voltages and the floating substrate. The curves, labeled 1, 2, and 3, represent increasing gate voltages. As the drain voltage increases, the thermionic emission from the substrate directly into the drain becomes important. It will be readily appreciated by those highly skilled in the art that for effective operation, the negative differential resistance should occur before the onset of such thermionic current.

Figure 7:
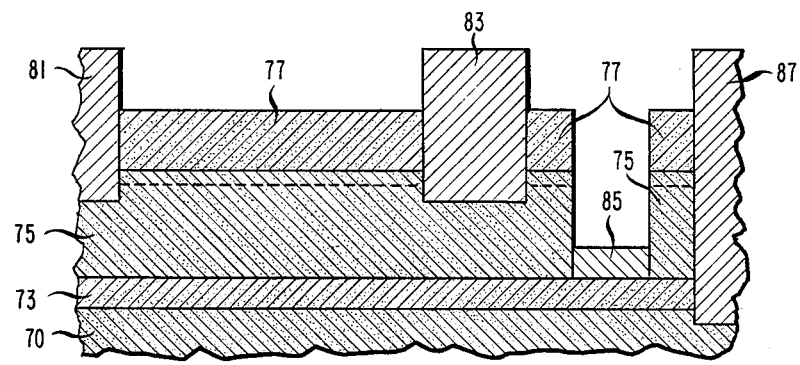
FIG. 7 is a sectional view of another embodiment of this invention.

The transfer of hot electrons from one conducting channel to another conducting channel can be used in memory devices if the substrate is kept floating. One such device is depicted in FIG. 7. The device comprises substrate 70, insulating Cr-doped GaAs; conducting channel 73, n-type GaAs 1000 Angstroms thick and with a dopant concentration of $10^{17}/cm^3$; potential barrier layer 75, $Al_xGa_{1-x}As$ 1500 Angstroms thick and nominally undoped with a composition graded from $x \geq 0.3$ to a value of x within the range from 0.0 to 0.1; and layer 77, n-type $Al_xGa_{1-x}As$ with a dopant concentration of $2\times 10^{18}/cm^3$ and 500 Angstroms thick. The dotted line indicates the presence of a two-dimensional electron gas. The device further comprises source 81 and first drain electrodes 83 to said first channel, indicated by the dashed lines, gate electrode 85 to said second channel, and second drain electrode 87. The second drain electrode is electrically connected to the source electrode.

When the gate voltage is negative, the lower conducting channel 73 is electrically isolated from the second drain electrode. If a voltage is now applied to the first drain electrode with respect to the grounded source 81, hot carriers move from the first to the second conducting channel where charge accumulates. Information may be read by measuring the channel resistance. The charge is removed, i.e., information is erased, by applying a positive voltage to the gate electrode.

The device depicted in FIG. 7, either with or without gate 85, is capable of performing all functions now performed by bipolar and field effect transistors. It is analogous to a bipolar transistor as it uses carrier injection and it is analogous to a field effect transistor as it is a unipolar device.

The device operation is perhaps best understood by analogy to a vacuum diode having a controlled cathode temperature. The channel performs the role of a cathode whose electron emission temperature is controlled by the source-to-drain voltage which can be varied at high frequencies. The second conducting channel 73, connected to electrode 87, serves as an anode. Electrically, the operation of this device is analogous to that of a bipolar transistor in which the emitter corresponds to source 81, the base to drain 83, and the collector to drain 87. It must be emphasized that unlike bipolar transistor, this device uses unipolar charge injection and does not suffer from minority carrier storage effects.

Figure 8:
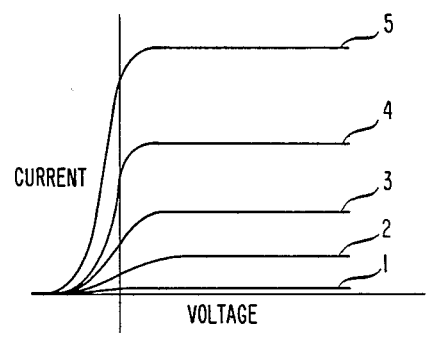
FIG. 8 is a plot of current-voltage characteristics for a device according to this invention.

FIG. 8 plots typical current-voltage characteristic curves with the current collected in drain, i.e., terminal, 87 plotted vertically and the voltage applied to this terminal with respect to the grounded drain horizontally for increasing emitter currents as shown by the numbers on the curves. It is apparent that the characteristics resemble those of a bipolar transistor in a common base configuration.

What is claimed is:

1. A semiconductor device comprising
three semiconductor regions which are spatially sequential in a first direction, and which here are designated, in sequence, as first channel region, potential-barrier region, and second channel region, said first and second channel regions having respective first and second bandgaps, and said potential-barrier region having a composition adapted to forming a potential barrier between said first and second channel regions;
means for supplying carriers to said first and second channel regions;

first and second contacts to said first channel region, said first and second contacts being spaced apart in a second direction which is perpendicular to said first direction, and said first and second contacts being such as not to make contact to said second channel region;

and a third contact to said second channel region.

2. The device of claim 1, said potential-barrier region having a third bandgap which is greater than said first and second bandgaps.

3. The device of claim 2, said third bandgap decreasing with increasing distance from said first channel region.

4. The device of claim 1, said device comprising a gate electrode to said first channel region.

5. The device of claim 1, said device comprising a gate electrode to said second channel region.

6. The device of claim 1, the material of said semiconductor regions being selected from the group consisting of Si, Ge, Group II-VI, and Group III-V semiconductor materials.

7. The device of claim 6, said Group III-V compound semiconductor materials comprising InAlAs and InGaAs.

8. The device of claim 1, said potential-barrier region comprising a heavily doped composition.

9. A logic element comprising two series-connected semiconductor devices, each of said devices comprising
three semiconductor regions which are spatially sequential in a first direction, and which here are designated, in sequence, as first channel region, potential-barrier region, and second channel region, said first and second channel regions having respective first and second bandgaps, and said potential-barrier region having a composition adapted to forming a potential barrier between said first and second channel regions;

means for supplying carriers to said first and second channel regions;

first and second contacts to said first channel region, said first and second contacts being spaced apart in a second direction which is perpendicular to said first direction, and said first and second contacts being such as not to make contact to said second channel region;

and a third contact to said second channel region.

* * * * *